United States Patent
Clementi et al.

(10) Patent No.: US 6,448,138 B1
(45) Date of Patent: Sep. 10, 2002

(54) NONVOLATILE FLOATING-GATE MEMORY DEVICES, AND PROCESS OF FABRICATION

(75) Inventors: Cesare Clementi, Busto Arsizio; Gabriella Ghidini, Milan; Mauro Alessandri, Vimercate, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/548,782

(22) Filed: Apr. 13, 2000

Related U.S. Application Data

(63) Continuation of application No. 08/792,621, filed on Jan. 31, 1997, now abandoned.

(30) Foreign Application Priority Data

Jan. 31, 1996 (EP) .............................................. 96830040

(51) Int. Cl.⁷ .......................................... H01L 21/8247
(52) U.S. Cl. ....................................... 438/264; 438/594
(58) Field of Search ................................ 438/257–267, 438/593–594

(56) References Cited

U.S. PATENT DOCUMENTS

| | | | |
|---|---|---|---|
| 4,775,642 A | 10/1988 | Chang et al. ................. | 437/44 |
| 4,780,431 A | 10/1988 | Maggioni et al. ............. | 437/52 |
| 5,298,446 A | 3/1994 | Onishi et al. ................ | 437/41 |
| 5,445,980 A | 8/1995 | Komori et al. ............... | 437/43 |
| 5,460,992 A | 10/1995 | Hasegawa .................... | 437/43 |
| 5,472,890 A | 12/1995 | Oda .............................. | 437/41 |
| 5,550,072 A | 8/1996 | Cacharelis et al. ........... | 437/43 |
| 5,663,080 A | 9/1997 | Cereda et al. ............... | 438/450 |
| 5,707,898 A | 1/1998 | Keller et al. ................. | 438/265 |
| 5,981,346 A | * 11/1999 | Hopper ........................ | 438/304 |
| 5,989,963 A | * 11/1999 | Luning et al. ............... | 438/289 |
| 5,994,179 A | * 11/1999 | Masuoka ..................... | 438/227 |

FOREIGN PATENT DOCUMENTS

| | | |
|---|---|---|
| DE | 4329304 | 3/1994 |
| JP | 62002664 | 1/1987 |
| JP | 6085280 | 3/1994 |
| WO | WO 94/20989 | 9/1994 |

OTHER PUBLICATIONS

Natsuo Ajika et al., "Formation of Inter–Poly Si Dielectrics by Rapid Thermal Processing," in Extended Abstracts of the 19th Conference on Solid State Devices and Materials, Tokyo, Japan, Aug. 25–27, 1987, pp. 211–214.

Tsui, Paul G.Y. et al., "Suppression of MOSFET Reverse Short Channel Effect by $N_2O$ Gate Poly Reoxidation Process," in International Electron Devices Meeting 1994, Dec. 11–14, 1994, pp. 501–504.

\* cited by examiner

Primary Examiner—Richard Booth
(74) Attorney, Agent, or Firm—Lisa K. Jorgenson; Robert Iannucci; Seed IP Law Group PLLC

(57) ABSTRACT

A process of fabricating a floating-gate memory device, the process including the steps of: forming a stack of superimposed layers including a floating gate region, a dielectric region, and a control gate region; and forming an insulating layer of oxynitride to the side of the floating gate region to completely seal the floating gate region outwards and improve the retention characteristics of the memory device. The insulating layer is formed during reoxidation of the sides of the floating gate region, after self-align etching the stack of layers and implanting the source/drain of the cell.

20 Claims, 1 Drawing Sheet

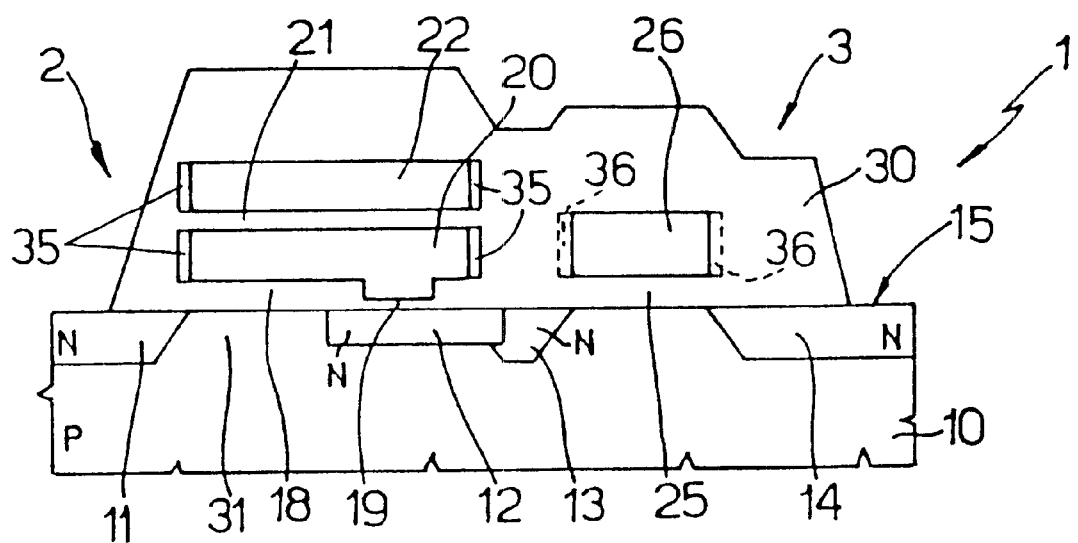

NONVOLATILE FLOATING-GATE MEMORY DEVICES, AND PROCESS OF FABRICATION

CROSS-REFERENCE TO RELATED APPLICATION

This application is a continuation of U.S. patent application Ser. No. 08/792,621, filed Jan. 31, 1997 now abandoned.

TECHNICAL FIELD

The present invention relates to a process of fabricating floating-gate memory devices, and to a memory device fabricated thereby.

BACKGROUND OF THE INVENTION

As is known, the fabrication of nonvolatile floating-gate memory devices comprises a sequence of steps commencing with a substrate of semiconductor material (monocrystalline silicon). More specifically, according to a typical fabrication process, a gate oxide layer is grown on the substrate, in which the active areas and any P- and N-wells required according to the process are already defined. A thin tunnel oxide region is possibly grown in the gate oxide layer (as in the case of EEPROM memories). A first polycrystalline silicon layer (poly1) is deposited and patterned to define it in a first, channel width direction on the oxide layers. An intermediate dielectric layer of silicon oxide or ONO—an acronym of silicon Oxide-silicon Nitride-silicon Oxide, is deposited or grown thermally on poly1. A second polycrystalline silicon layer (poly2) is deposited on the dielectric layer. A tungsten silicide layer is possibly deposited on poly2. The stack of poly2, ONO and poly1 layers is self-align etched to define the stacked floating and control gate regions in a second, channel-length direction perpendicular to the first direction. Next, the source/drain regions of the cell are implanted. A "reoxidation" heat treatment is performed to seal the floating gate region. Now, the source and drain regions of peripheral circuit transistors are formed and reoxidized. And finally, the contacts and interconnecting layer are formed and a passivation layer is deposited.

One of the most critical steps in the above process, regardless of the architecture being formed, is the reoxidation step. The reoxidation step, as stated, provides for sealing the floating gate region of the cells to prevent direct contact with the outside environment, ensure long-term retention of the charge stored in the region, and so ensure good quality of the memory even in the event of prolonged operation.

The reoxidation step may also serve other purposes. First, this step helps in stabilizing the tungsten silicide layer which may form part of the control gates of the devices, including both the cells and the circuit transistors. Second, the reoxidation step provides for diffusing in the substrate the normally implanted dopant that determines the electric characteristics of the devices.

It is desired that the reoxidation step be made as effective as possible to insure the insulation and charge retention of nonvolatile memories.

To improve the electric characteristics of transistors, an article entitled "Suppression of MOSFET Reverse Short Channel Effect by $N_2O$ Gate Poly Reoxidation Process" by P.G.Y. Tsui, S. H. Tseng, M. Orlowski, S. W. Sun, P. J. Tobin, K. Reid and W. J. Taylor, IEDM 94, 19.5.1, proposes, during final reoxidation of the gate region, to use a gas for nitriding the interface between the silicon substrate and gate oxide, at least in the areas closest to the exposed sides of the transistor. In particular, oxinitriding is aimed at eliminating the reverse short channel effect (i.e., the increase in the threshold voltage of short channel MOSFET transistors) generally attributed to an uneven lateral channel profile caused, among other things, by reoxidation resulting in the formation of supersaturated silicon interstitial.

SUMMARY OF THE INVENTION

It is an object of the present invention to provide a fabrication process enabling improved insulation of the floating gate of nonvolatile floating-gate memory devices.

According to the present invention, there is provided a process of fabricating floating-gate memory devices. More specifically, on a substrate, an insulated control gate region is formed on a floating gate region. Next, an insulating layer of oxynitride is formed on the side of the floating gate region.

BRIEF DESCRIPTION OF THE DRAWINGS

A preferred, non-limiting embodiment of the present invention will be described by way of example with reference to the accompanying drawing.

FIG. 1 shows a cross section of a wafer of semiconductor material, in which is formed a memory cell in accordance with the present invention.

DETAILED DESCRIPTION OF THE INVENTION

In the following description, reference will be made, purely by way of example, to an embodiment of the present process for forming an EEPROM memory cell. Since, however, the oxinitriding step performed during reoxidation and characteristic of the present invention is not limited solely to the fabrication of EEPROM cells, but may also be applied to any process of fabricating memories with floating gate cells, the same also applies to the formation of EPROM and flash-EEPROM memory devices.

Research and experiments by the present Applicant have now shown that the use of nitriding a gas when reoxidizing the floating gate region of nonvolatile memories provides for forming a thin oxynitride layer contacting the polycrystalline silicon forming the floating gate region. The oxynitride layer of the floating gate provides for improved insulation between the floating gate region of stacked-gate memory cells and the outside environment.

The fabrication process according to the present invention comprises the same initial steps as in known processes. More specifically, the process steps include forming P/N wells in the monocrystalline silicon substrate; growing the field oxide to define the active areas; and forming the isolation regions and/or channel stoppers. Next, an electric continuity region is formed in the substrate and a gate oxide layer is grown. A thin tunnel oxide region is grown in the gate oxide layer. A first polycrystalline silicon layer (poly1) is deposited on the oxide structure and is patterned to define it widthwise. Over the patterned poly1 layer, an intermediate dielectric layer of oxide or ONO is deposited or grown. A second polycrystalline silicon layer (poly2) is deposited and a tungsten silicide layer is possibly deposited. With this structure, the poly2, ONO and poly1 layers are self-align etched to define, lengthwise, the stacked floating and control gate regions and two sides of the floating gate region (defining it lengthwise) and of the control gate region are exposed.

At this point, the source/drain is implanted in a conventional manner, and reoxidation is performed to seal the floating gate region. According to one embodiment of the present invention, reoxidation is performed by heat treating the wafer of semiconductor material in an oven or RTP (rapid thermal processing) facility. The RTP facility exposes the wafer to batteries of lamps for generating a rapid rise and fall in temperature ranging from 800 to 1000° C., in an environment containing $N_2O$, NO or $NH_3$, and for a time ranging from a few tens of seconds (RTP treatment) to a few hours (oven treatment). This results in the formation, on the exposed sides of the floating gate and control gate, of a thin layer of oxynitride ($Si_xO_yN_z$), which, by virtue of its excellent insulating properties, provides for optimum sealing of the floating gate, region.

Then, conventional steps are performed for forming the selection transistor relative to the cell. First, the gate regions of the peripheral circuit transistors are formed. Second, the source and drain of the transistors are implanted, possibly preceded by a light implant and the formation of oxide spacers, in the case of Light Doped Drain LDD devices. Next, a surface reoxidate step is provided which may also be performed in nitrided manner, as described above, to improve the electric characteristics as indicated in the above article by Tsui et al. Finally, the contacts and the interconnecting layer are formed, and the passivation layer is deposited.

The structure of the resulting memory device is illustrated in the accompanying drawing wherein the memory device 1, the memory cell and relative sensing transistor 2, and the selection transistor 3 are shown. More specifically, a P-type substrate 10 contains an N-type source region 11 of the cell, an implanted N-type electric continuity region 12, an N-type drain/source region 13 defining the drain region of cell 2 and the source region of selection transistor 3, and an N-type drain region 14 for selection transistor 3. The substrate region 31 between source region 11 and electric continuity region 12 forms the channel of cell 2, and region 11–14 all face the surface 15 of substrate 10.

Now, a gate oxide region 18 of cell 2, incorporating a thin tunnel oxide region 19 is stacked on surface 15. Next, a floating gate region 20 of cell 2, an interpoly dielectric layer 21; and a control gate region 22 of cell 2 are sequentially stacked on the oxide regions 18 and 19. A gate oxide region 25 and a gate region 26 of selection transistor 3 are also stacked on surface 15. An intermediate dielectric layer 30 covers the resultant structure and insulates the various layers.

As can be seen, according to the present invention, thin oxynitride layers 35 are formed on either side of floating gate region 20 and control gate region 22. Layers 35 seal the sides of regions 20 and 22 extending in the channel width direction, i.e., perpendicularly to the plane of the drawing and to the channel length, and as measured between source region 11 and electric continuity region 12. Similar oxynitride layers 36 (dotted line) may be formed in selection transistor 3 and in the circuit transistors (not shown).

The advantages of the process according to the present invention are clear from the above description. In particular, it provides for improved retention of the resulting memory by improving sealing of the floating gate region of the cells. Oxinitriding the floating gate region provides for exploiting the advantages afforded by the improvement of the electric parameters also in the cells. Forming the oxynitride layer also during reoxidation of the selection and circuit transistors, as described in the abovementioned article, provides for also improving the electric characteristics of the transistors. The process involves no particular technical difficulties or additional fabrication steps, and therefore no appreciable increase in cost.

Clearly, changes may be made to the process and memory device as described and illustrated herein without, however, departing from the scope of the present invention. In particular, oxinitriding of the floating gate region as described above may be applied to any process of fabricating nonvolatile floating-gate memories, including all EPROM, EEPROM and flash-EEPROM processes.

What is claimed is:

1. A process of fabricating floating-gate memory devices, the process comprising the steps of:

forming a floating gate region;

forming a dielectric region over said floating gate region;

forming a control gate region over said dielectric region;

forming a source region and a drain region;

forming an insulating layer of oxynitride to the side of and directly adjacent to said floating gate region; wherein said step of forming an insulating layer further includes the step of oxinitriding lateral portions of said floating gate region.

2. The process as claimed in claim 1 wherein said oxinitriding step further includes the step of thermally oxidizing said lateral portions in an atmosphere containing nitrogen.

3. The process as claimed in claim 2 wherein said atmosphere further includes components selected from a group including $N_2O$, NO, $NH_3$ and mixtures thereof.

4. The process as claimed in claim 2 wherein said thermal oxidizing step is performed at temperatures ranging between 800 and 1000° C.

5. The process as claimed in claim 2 wherein said thermal oxidizing step is performed in an oven or RTP facility.

6. A process of fabricating floating-gate memory devices, the process comprising the steps of:

forming a floating gate region;

forming a dielectric region over said floating gate region;

forming a control gate region over said dielectric region;

forming a silicide layer over said control gate;

forming a source region and a drain region;

forming an insulating layer of oxynitride to the side of and directly adjacent to said floating gate region;

forming a layer of insulating material on a substrate of semiconductor material;

forming, over said layer of insulating material, a stack of superimposed layers comprising a first layer of semiconductor material, a dielectric material layer, and a second layer of semiconductor material;

chemically etching said stack of layers in aligned manner; and oxidizing exposed lateral portions of said first and second layers of semiconductor material in the presence of nitrogen.

7. The process as claimed in claim 6 further including, prior to said oxidizing step and after said chemical etching step, an implant step performed to implant said substrate with chemical species for modifying the conductivity of said substrate.

8. A process of fabricating floating-gate memory devices, the process comprising the steps of:

forming an insulating layer on a semiconductor substrate;

forming a first polysilicon layer over said insulating layer;

forming a dielectric material layer over said first layer;

forming a second polysilicon layer over said dielectric layer;

defining said insulating, first polysilicon, dielectric material, and second polysilicon layers, forming source and drain regions, and thermally oxidizing the exposed portions of said second polysilicon layer in the presence of nitrogen to form insulating sidewalls on the exposed portions; and forming insulating and metal contact layers on the resultant structure, wherein said insulated sidewalls are formed of an oxynitride material having sealing means for increasing the retention of memory in said devices.

9. The process of claim 8 wherein said step of defining further includes etching to expose said insulating layer.

10. A process of fabricating floating-gate memory devices, the process comprising the steps of:

forming an insulating layer on a semiconductor substrate;

forming a first polysilicon layer over said insulating layer;

forming a dielectric material layer over said first layer;

forming a second polysilicon layer over said dielectric layer;

forming a silicide layer over the second polysilicon layer;

defining said above layers, forming source and drain regions, and thermally oxidizing the exposed portions of said second polysilicon layer in the presence of nitrogen to form insulating sidewalls on the exposed portions; and forming insulating and metal contact layers on the resultant structure, wherein said step of etching further includes etching to expose said insulating layer and said step of forming sidewalls further includes forming sidewalls on the exposed portions of said first polysilicon layer.

11. The process of claim 10 wherein said insulated sidewalls are formed of an oxynitride material having sealing means for increasing the retention of memory in said devices.

12. The process of claim 8 wherein said presence of Nitrogen is selected from a group including $N_2O$, $NO$, $NH_3$ and mixtures thereof.

13. The process of claim 12 wherein said thermal oxidizing step is performed at temperatures ranging between 800 and 1000° C.

14. The process of claim 8, further including the step of depositing a tungsten silicide layer on said second polysilicon layer.

15. The process of claim 8, further including the step of forming self-aligned source and drain regions in said substrate after said step of defining portions of the resultant structure.

16. The process of claim 8, further including the steps of:

forming a well of a first conductivity type in said substrate;

growing field oxide regions to define the active regions in said substrate;

forming channel stop regions in said substrate;

implanting an electric continuity region of a second conductivity type in said substrate;

forming insulating and metal contact layers on the resultant structure.

17. The process of claim 8, further including the step of forming selection and circuit transistors having insulated sidewalls formed in the presence of nitrogen on said substrate.

18. The method of claim 7 wherein the step of forming the insulating layer of oxynitride is performed after forming the source region and the drain region.

19. The method of claim 1, further comprising forming a silicide layer over said control gate.

20. The method of claim 8, further comprising forming a silicide layer over the second polysilicon layer.

* * * * *

UNITED STATES PATENT AND TRADEMARK OFFICE
CERTIFICATE OF CORRECTION

PATENT NO.    : 6,448,138 B1
DATED         : September 10, 2002
INVENTOR(S)   : Cesare Clementi et al.

It is certified that error appears in the above-identified patent and that said Letters Patent is hereby corrected as shown below:

Column 6,
Line 30, "The method of claim 7" should read as -- The method of claim 2 --.

Signed and Sealed this

Eighteenth Day of March, 2003

JAMES E. ROGAN
*Director of the United States Patent and Trademark Office*